United States Patent [19]

Gidlof

[11] 4,036,431
[45] July 19, 1977

[54] METHOD AND APPARATUS FOR USE IN SETTING A COUNTER

[76] Inventor: Lars F. Gidlof, 999 N. Doheny Drive, Los Angeles, Calif. 90069

[21] Appl. No.: 673,199

[22] Filed: Apr. 2, 1976

[51] Int. Cl.² .................. H03K 21/36; G06M 3/14
[52] U.S. Cl. ..................... 235/92 PE; 235/92 MS; 235/92 EV; 235/92 R; 328/48
[58] Field of Search ........ 235/92 PE, 92 MS, 92 EV; 328/48

[56] References Cited

U.S. PATENT DOCUMENTS

| | | | |
|---|---|---|---|
| 3,665,323 | 5/1972 | Peterson | 235/92 EV |
| 3,764,783 | 10/1973 | Terry et al. | 235/92 PE |
| 3,843,873 | 10/1974 | Beville et al. | 235/92 EV |
| 3,962,565 | 6/1976 | Guyen-Phuoc | 235/92 PE |
| 3,968,401 | 7/1976 | Bryant | 328/48 |

*Primary Examiner*—Joseph M. Thesz
*Attorney, Agent, or Firm*—Edward D. O'Brian

[57] ABSTRACT

During the use of a counter which provides an output indicating a numeric value corresponding to the number of pulses received at a terminal of the counter and which will count either up or down dependent upon a signal at another terminal of the counter, it is frequently necessary to set the counter at the start of a counting operation so that the output of the counter indicates a specific number. Such a counter can be set so as to indicate such a number through the use of a single switch. When the switch is closed a short time interval a single pulse is applied to the first terminal of the counter. When the switch is held closed for a longer time period a signal is applied to the other terminal of the counter so as to control the direction of the counting operation and a series of pulses is supplied to the first terminal of the counter. The switch will be held closed until the counter output indicates either a desired numeric value or a number in excess of this value. If the output indicates a number in excess of this desired value the swich may be closed and opened for successive short time intervals until the specific desired numeric value is indicated by the counter output.

6 Claims, 1 Drawing Figure

U.S. Patent   July 19, 1977   4,036,431
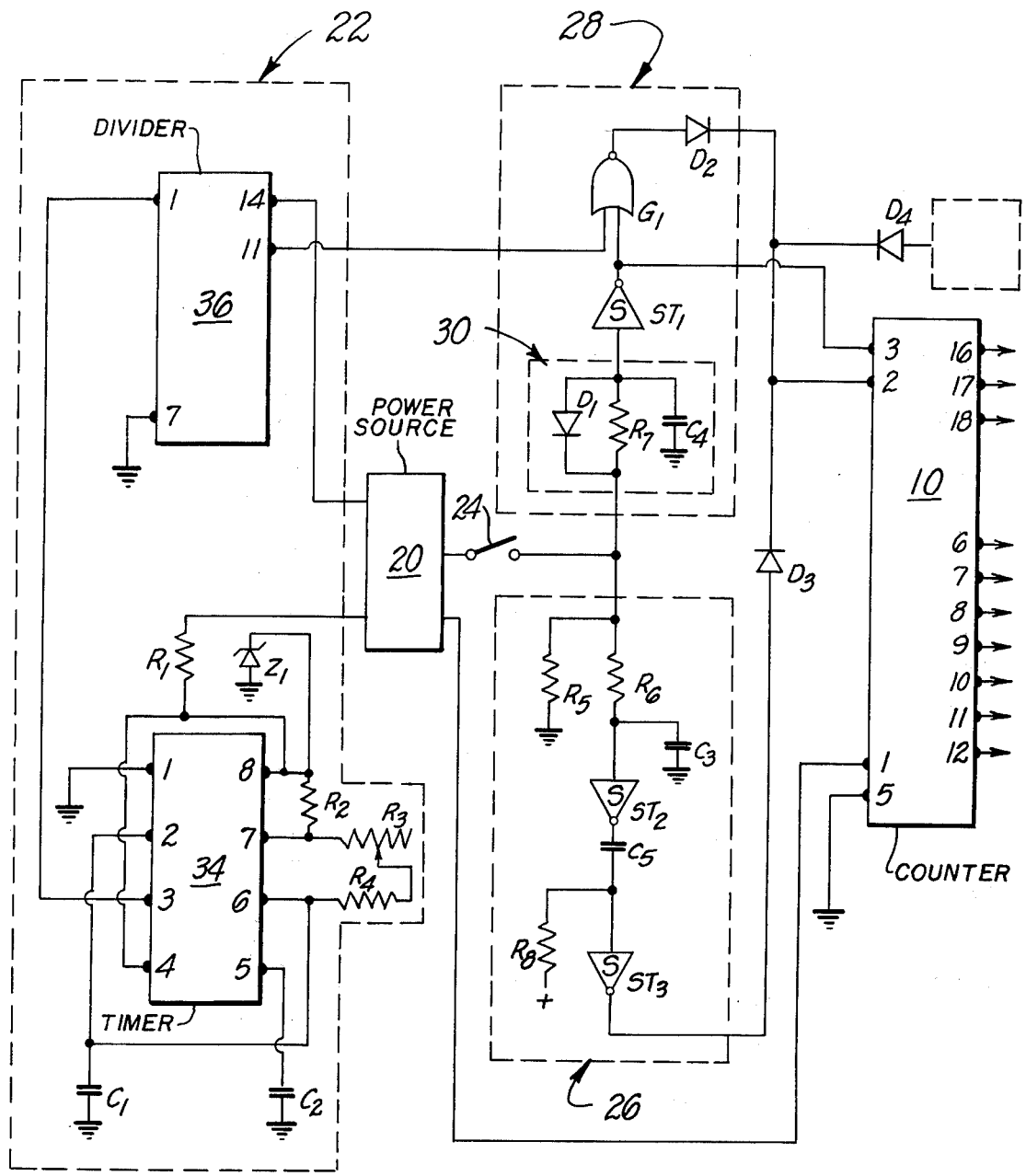

METHOD AND APPARATUS FOR USE IN SETTING A COUNTER

CROSS-REFERENCE TO RELATED APPLICATIONS

None.

BACKGROUND OF THE INVENTION

The invention set forth in this specification pertains to a new and improved method and apparatus for use in operating a counter so as to set the counter to a desired value.

The counters to which the present invention pertains are electronic counting devices which are capable of counting electrical pulses supplied to them from an exterior source in order to provide an output indicating a numeric value corresponding to the number of such pulses. These counting devices or counters are capable of either counting up or counting down depending upon the nature of a control signal used with them. Such counting devices have wide utility in connection with a number of extremely diverse applications. They are primarily utilized in providing outputs capable of being used to display a numeric value through the use of an appropriate, known, numeric display apparatus. Such counters are well adapted for use in connection with various known types of liquid crystal and light emitting diode displays.

In most applications of such counters or counting devices it is necessary and/or desirable for a user to preset the counter so that the numeric output of the counter is at a predetermined value prior to the counter being utilized in connection with a counting operation. In the past a number of expedients have been proposed and used in connection with presetting counters of the type indicated. An understanding of the present invention is not considered to require a detailed reference to the various manners in which these counting devices have been set to desired predetermined output values prior to or during their use.

In general it has been most conventional to utilize a series of switches so as to "load" a counter in presetting the counter so that the output of the counter indicates a desired predetermined value. These and various other expedients which have been utilized in presetting counters are considered to be undesirably expensive and are considered to be undesirable because of the space or volume normally occupied by the presetting components utilized. This latter is more important than a person might normally realize. Because of space limitations in various locations, such as in an aircraft cockpit, it is normally necessary and/or desirable to use a resetting mechanism for a counter which does not take up any significant amount of control panel space.

SUMMARY OF THE INVENTION

The present invention is intended to provide a new and improved way of setting a counter or counting device of the type indicated so that the output of such a counter indicates a desired numeric value prior to and/or during a counting operation. An objective of the invention is to provide a new improved manner of presetting such a counter which is comparatively simple, which is effective for its intended purpose and which eliminates the need for resetting equipment of a comparatively bulky nature. A further objective of the present invention is to provide an apparatus for use in setting a counter which is comparatively simple to construct, which is relatively inexpensive, which is capable of giving prolonged, reliable performance with minimum maintenance, and which is of such a nature as to require comparatively limited space and in particular comparatively limited space in a display or a control console.

In accordance with this invention these objectives are achieved by providing an apparatus for use in setting the output of a counting means capable of providing an output indicating a numeric value corresponding to the number of electric pulses supplied to a first terminal of the counting means, which numeric value is capable of being either increased or decreased as pulses are supplied to the counting means in accordance with a signal supplied to a second terminal of the counting means, this apparatus comprises:

power supply means, a first pulse generating means for providing a continuous series of electric pulses connected to the power supply means, a second pulse generating means for providing a pulse to the first terminal of said counting means after a first time interval, control means for concurrently providing a signal to the second terminal of the counting means and a series of pulses from the first pulse generating means to the first terminal of the counting means, after a time interval which is greater than the first time interval, and switch means for concurrently connecting the second pulse generating means and the control means to the power supply for any desired time interval.

BRIEF DESCRIPTION OF THE DRAWING

Because of the nature of the invention it is considered best more fully described with reference to the remainder of this specification and to the accompanying drawing in which:

The FIGURE is a circuit diagram of a presently preferred apparatus for use in setting a counter in accordance with the invention.

The circuit illustrated in the drawing utilizes certain operative concepts or principles as are set forth and defined in the appended claims. It will be recognized that these concepts or principles can be utilized in a number of different ways through the use or exercise of what is now conventional or routine skill in the electronic field. For this reason the invention is to be considered as being limited solely by the appended claims.

DETAILED DESCRIPTION

In the drawing there is shown a counter 10 which is adapted to be controlled or operated in accordance with the invention. This counter 10 includes an input terminal 2 which is adapted to receive electric pulses so that such pulses may be converted within the counter 10 to an output fed to a plurality of output terminals 6–12 and 16–18 connected to and to operate a conventional numeric display (not shown) in accordance with the number of electric pulses supplied to the counter 10. This counter 10 also includes a second terminal 3 which is adapted to receive an electric signal so as to control the direction of the counting operation performed—i.e., so that the counter 10 either counts up or counts down.

This counter 10 has a grounded terminal 5 and a terminal 1 connected to a power source 20. During the normal use of the counter 10 in connection with a counting operation, pulses are supplied to the terminal 2 from an appropriate source such as an instrument (not shown) providing an indication of fluid flow or the like through a protective diode D4. Inasmuch as appropriate sources capable of being used to supply input pulses to the counter 10 are well known it is considered that there is no need or necessity to describe any such source in detail.

In accordance with this invention the operation of the counter 10 can be controlled so as to set or load the counter 10 in such a manner that the output at the noted terminals corresponds to any desired numeric value. Such control is accomplished through the use of an oscillator structure 22 normally connected to the power source 20 so as to provide a continuous series of electrical pulses at a comparatively rapid rate. Because of the function of the oscillator 22 it may be regarded as a first pulse generating means. The apparatus of the invention also includes a switch 24 which may be closed so as to connect a second pulse generating means 26 and a control means 28 to the power source 20 at the same time.

The switch 24 used is preferably a normally open switch capable of being manually closed for either a very short time interval or capable of being held closed indefinitely. Preferably the switch 24 is a multi-function switch capable of performing other functions other than the specific functions noted in the preceding. When the switch 24 is such a multi-function switch, space on a control or instrument panel can be effectively minimized. The second pulse generating means 26 is a single pulse generator capable of supplying only a single short electric pulse to the terminal 2 through a diode D3 each time that the switch 24 is closed. In effect this second pulse generating means 26 can be referred to as a single pulse generator because of its function. It will provide a pulse to the terminal 12 within a comparatively short time interval each time the switch 24 is closed.

When the switch 24 is closed current will also be supplied to the control means 28. This control means 28 includes a time delay network 30 which provides an output after a time interval which is longer than the time interval required for the second pulse generating means 26 to provide a pulse to the counter 10. The output signal from this time delay means 30 is utilized to actuate a Schmitt trigger ST1 so as to simultaneously provide a signal to the terminal 3 of the counter 10 in order to change the direction in which the counter 10 must count as pulses are received by it at the terminal 2 and to operate a gate G1 so as to supply a continuous chain of pulses at a comparatively rapid rate from the oscillator 22 to the terminal 2 of the counter 10. Such a signal will be applied to the terminal 3 and such pulses will be supplied to the terminal 2 as long as the switch 24 is closed.

The method of presetting the counter 10 using the described parts is comparatively simple and can be illustrated with reference to the counter 10 being used so as to count down to indicate the quantity of a product remaining in a container as the product is used or consumed. At the start of any such counting operation for this purpose it is necessary to set the counter 10 so that the output of the counter 10 indicates the total quantity of the commodity to be counted, such as, for example, the total amount of liquid in a tank. For this type of counting the counter 10 will be of such a character that in the absence of a signal to the terminal 3 it will count down.

To set the counter 10 for such a total quantity or value the switch 24 will be closed. This will cause the second pulse generator 26 to provide a single pulse to the terminal 12 of the counter 10. This will cause a reduction of one in the output of the counter 10. As the switch 24 is held closed the time delay network 30 will, after the pulse has been generated by the second pulse generator 26, activate the switch trigger ST1 so as to provide a signal to the terminal 3 so as to cause the counter 10 to count up as pulses are received at the terminal 2. Concurrently the gate G1 will act as a switch or switch means so as to permit a series of rapid pulses to pass to the terminal 2 to cause a corresponding rapid increase in the numeric value indicated by the output of the counter 10.

When a desired numeric value is indicated the switch 24 will be opened. Because of the rapidity of the pulses supplied by the oscillator 22 normally it will be impossible to open this switch 24 at precisely the time that such a numeric value is indicated. Hence, normally the switch 24 will be opened at a time interval in which the numeric output of the counter 10 is slightly greater than the maximum desired setting. The numeric value indicated by the counter 10 may then be decreased to a desired value by rapidly closing and opening the switch 24. Each time the switch 24 is closed and opened in this manner the second pulse generator 26 will provide a pulse to the terminal 2 reducing the numeric value indicated by the output of the counter 10 by one. Each time the switch 24 is opened and closed in this manner at a comparatively rapid rate the control means 28 will not become operative because of the action of the time delay network 30.

Obviously there are many ways that functions as are indicated in the preceding can be accomplished. When the counter 10 employed is a General Instrument AY-5-4007-D integrated circuit device it is considered desirable to use as the oscillator 22 a circuit as indicated in the drawing. This circuit employs a National Semi-conductor Corporation LM555 timer 34 to generate square wave pulses at a frequency of 150 Hz. which are conveyed to a Radio Corporation of America CD4024 divider 36, the output of which is connected to the Gate G1. A suitable gate for use with the various integrated circuits described is a Radio Corporation of America CD4001 device. This oscillator 22 also includes a conventional voltage dropping resistor R1, a zener diode Z1 for providing a constant voltage, a frequency adjusting capacitor C1, a bypass capacitor C2 and adjusting resistors R2, R3, and R4. The timer 34 and divider 36 are connected with their terminals as indicated in the drawing.

The second pulse generator 26 utilizes a capacitor C5 and a resistor R8 connected to the power source 20 for pulse generation purposes. It also employs Schmitt triggers ST2 and ST3 for the purpose of providing desired polarities and to assist in controlling the shape of the wave pulse produced by the generator 26. The particular Schmitt triggers which have been used with the other integrated circuits noted are National Semi-conductor Corporation MM74C14 devices. The resistors R5 and R6 and the capacitor C3 are employed to aid in controlling pulse shape by minimizing what may be referred to as "contact bounce" resulting from the operaton of the switch 24.

The control means 28 includes in the time delay 30 a resistor R7 in parallel with a diode D1 and a grounded capacitor C4. When the capacitor C4 becomes charged after the switch 24 is closed the Schmitt trigger ST1 is operated so as to open the gate G1 and so as to provide a signal to the terminal 3 of the counter 10 in order to change the direction in which this counter 10 will count or operate. A suitable Schmitt trigger ST1 for use with the other integrated circuit devices described is the same as identified in the preceding.

In the preceding description no effort has been made to specifically indicate the numerical values of various resistors, capacitors, and diodes as described since it is considered that it is unnecessary to give such values in order to indicate how the invention may be practiced. It is believed that anyone with reasonable skill in the electronics field should be able to simply and easily construct an apparatus as herein described on the basis of the disclosure made in the preceding of specific integrated circuit devices. In the drawing the terminals of the counter 10, the timer 34 and the divider 36 shown are those on the specific integrated circuit devices described.

It is considered that the invention makes it possible to easily and conveniently preset a counter to a desired numeric value utilizing only a single switch as the operative control used in setting the counter. It is considered quite unique to utilize a switch as described in the preceding so the closing of such switch for only a short period of time provides a pulse which is counted in one direction and so that closing of the switch for a longer time interval provides for reversal or causes a reversal of the direction in which the counter counts and concurrently releases to the counter a rapid series of pulses which will rapidly cause the numerical output of the counter to change in the direction dictated by the signals supplied to the counter.

I claim:

1. An apparatus for use in setting the output of a counting means capable of providing an output indicating a numeric value corresponding to the number of electric pulses supplied to a first terminal of said counting means, which indicated number is capable of being either increased or decreased as said pulses are supplied to said counting means in accordance with a signal supplied to a second input terminal of said counting means, said apparatus comprising:
   power supply means for supplying electric power,
   a first pulse generating means for providing a series of electric pulses capable of being counted by said counting means, said first pulse generating means being connected to said power supply means,
   a second pulse generating means for providing within a first time interval a pulse capable of being counted by said counting means each time a current is supplied to said second pulse generating means,
   control means for concurrently within a second time interval which is greater than said first time interval providing a signal to said second input terminal of said counting means and providing pulses from said first pulse generating means to said first terminal of said counting means each time current is supplied to said control means, and
   normally open switch means for concurrently connecting said control means and said second pulse generating means to said power supply so that when said switch means is closed current is simultaneously supplied to said control means and said second pulse generating means.

2. An apparatus as claimed in claim 1 wherein:
said first pulse generating means is an oscillator.

3. An apparatus as claimed in claim 1 wherein:
said second pulse generating means is a single pulse generator.

4. An apparatus as claimed in claim 1 wherein:
said control means includes a time delay means, means for providing a signal to control the direction of counting of said counter, and means for connecting said oscillator to said first terminal of said counter means when said means for providing a signal is actuated, said time delay means serving to operate said means for providing a signal when said switch means is closed for a longer time interval than required for said second pulse generating means to provide a pulse to said counting means.

5. An apparatus as claimed in claim 1 wherein:
said first pulse generating means is an oscillator,
said second pulse generating means is a single pulse generator,
said control means includes a time delay means, means for providing a signal to control the direction of counting of said counter, and means for connecting said oscillator to said first terminal of said counter means when said means for providing a signal is actuated, said time delay means serving to operate said means for providing a signal when said switch means is closed for a longer time interval than required for said second pulse generating means to provide a pulse to said counting means.

6. A process for setting a counting means which will count electrical pulses supplied to a first terminal thereof either up or down in accordance with a signal supplied to a second terminal thereof which comprises:
   concurrently supplying a signal to said counting means so as to cause it to count in a desired direction while concurrently supplying a rapid series of pulses to said first terminal of said counting means until said counting means indicates a number of pulses counted in excess of a desired setting value,
   thereafter operating said counting means in the opposite direction and supplying individual pulses to said counting means until said counting means indicates a desired setting value,
   carrying out said steps by the operation of a single switch which when closed simultaneously supplies current to a single pulse generator and to a control means,
   said control means serves to supply said signal and to control said series of pulses being supplied to said counter means,
   said single pulse generator means is capable of releasing a single pulse each time said switch is closed prior to said control means functioning to supply said signal and controlling said series of pulses being supplied to said counter means.

* * * * *